United States Patent [19]
Cronin

[11] Patent Number: 5,164,880
[45] Date of Patent: Nov. 17, 1992

[54] ELECTROSTATIC DISCHARGE PROTECTION DEVICE FOR A PRINTED CIRCUIT BOARD

[75] Inventor: David V. Cronin, Peabody, Mass.

[73] Assignee: Polaroid Corporation, Cambridge, Mass.

[21] Appl. No.: 662,953

[22] Filed: Mar. 1, 1991

[51] Int. Cl.$^5$ .................. H05F 1/00; H01H 3/16; H01R 13/703
[52] U.S. Cl. .................. 361/220; 200/51.1; 439/188
[58] Field of Search ............ 361/54, 212, 220, 424; 307/100; 200/51 R, 51.09, 51.1; 439/188

[56] References Cited

U.S. PATENT DOCUMENTS

| | | | |
|---|---|---|---|
| 4,138,711 | 2/1979 | Bremenour et al. | 361/424 |
| 4,179,178 | 12/1979 | Bachman et al. | 439/188 |
| 4,223,368 | 9/1980 | Dattilo | 361/220 |
| 4,725,918 | 2/1988 | Bakker | 361/220 |
| 4,726,775 | 2/1988 | Owen | 439/49 |
| 4,850,888 | 7/1989 | Denlinger et al. | 439/188 |

FOREIGN PATENT DOCUMENTS 2822968 11/1978 Fed. Rep. of Germany .
57-152581 12/1982 Japan .
2219699 12/1989 United Kingdom .

Primary Examiner—A. D. Pellinen
Assistant Examiner—David Osborn
Attorney, Agent, or Firm—Ralph R. Veseli

[57] ABSTRACT

An electrostatic discharge protection device is disclosed for use with a printed circuit board (hereafter referred to as "PCB") of the type having a major portion and a dependent integral tongue having oppositely disposed PCB surfaces with conductor pads disposed thereon. The electrostatic discharge protection device comprises a first hinge structure and a second hinge structure mounted to corresponding PCB surfaces. Each hinge structure has a base section securely mounted to the PCB surface, an elongated arm section pivotally connected to the base section and having an electrically conductive bar disposed along the length thereof, and means for urging the electrically conductive bar against and into electrical interconnection with the conductor pads while the PCB remains disconnected from a complementary edge connector. The PCB's subsequent mating with the edge connector operates to pivot the arm section away from the base section so as to electrically and physically disengage the electrically conductive bar from the conductor pads.

10 Claims, 2 Drawing Sheets

ELECTROSTATIC DISCHARGE PROTECTION DEVICE FOR A PRINTED CIRCUIT BOARD

FIELD OF THE INVENTION

This invention relates to an electrostatic discharge (hereafter referred to as "ESD") protection device for a printed circuit board (hereafter referred to as "PCB") having a plurality of conductor pads disposed along an edge portion thereof in which a plurality of the conductor pads are continuously shorted and then, upon connection of the PCB to an edge connector, automatically unshorted.

BACKGROUND OF THE INVENTION

For a PCB which mates with an edge connector, it is often necessary to automatically short together a plurality of edge conductor pads on the PCB while the PCB is disconnected from the edge connector in order to protect the PCB's circuitry from ESD. Such ESD protection devices have been either custom designed for use in a specific PCB-edge connector or off-the-shelf for use in many different PCB-edge connector types.

A custom designed ESD protection device is typically fabricated on the PCB and coupled with a specifically configured edge connector which together provide the conductor pads with effective protection against ESD. An example of such a custom designed ESD protection device is illustrated in U.S. Pat. No. 4,179,178 issued to Bachman et al. on Dec. 18, 1979. This patent shows an edge connector having a pair of elongated ground pins for mating with complementary receptacles disposed in a cartridge which surrounds the PCB. Within the cartridge and disposed above the PCB resides an ESD protection device that includes a protuberant region which extends laterally over both the conductor pads and the receptacles. The protuberant region has a plurality of fingers arranged over the PCB so that each finger is disposed over a corresponding conductor pad. When the PCB is disconnected from the connector, each protuberant finger conductively engages the associated conductor pad. This shorts all the conductor pads together and protects them from ESD. Correspondingly, when the edge connector is mated with the PCB, the pair of ground pins displace the protuberant region from the receptacle so that the protuberant fingers disengage from the conductor pads.

Although providing effective ESD protection, this custom-designed device along with most custom-designed ESD devices suffer from a lack of interchangeability. That is, only the custom designed edge connector and no others can successfully mate with and operate with a PCB that employs such a custom designed device. This lack of interchangeability coupled with the large number of different custom-designed ESD protection devices has hindered widespread application of these devices within the PCB industry. Moreover, acceptance of these custom designed devices has been further hindered by (1) the high cost to manufacture these devices, (2) the added complexity that these devices introduce into the PCB manufacturing process, but most importantly, (3) the reduction in PCB chip density because of the board space that these devices occupy.

For all of the above reasons, PCB manufacturers presently employ a variety of off-the-shelf devices to protect their PCB circuitry against ESD. For example, the typical "add on" PCB for a personal computer presently arrives from the manufacturer with either conductive foam or wires disposed around the conductor pads, with the entire PCB sealed within an ESD protective bag, which is itself sealed within a box containing conductive foam pellets. These off-the-shelf devices (i.e., conductive foam and protective bags) provide the PCB with effective ESD protection until the User removes the wires or conductive foam from the conductor pads. At that point, the PCB is vulnerable to ESD because all the ESD protective devices have been removed. Accordingly, when the User subsequently attempts to place the PCB into an edge connector, a sizable number of the PCB's could be damaged by ESD and would have to be replaced. Consequently, a need still exists within the PCB industry for an off-the-shelf device which effectively protects the PCB from ESD until the PCB is mounted to an edge connector.

SUMMARY OF THE INVENTION

With the foregoing in mind, the primary object of the present invention is to provide an ESD protection device on a PCB which operates in a simple, economical, and effective manner to automatically short a plurality of the conductor pads together while the PCB is disconnected from an edge connector.

It is a further object of the present invention to provide an ESD protection device on a PCB which operates to automatically open the short between the conductor pads upon the PCB's connection to an edge connector which has not been specifically adapted to effect such opening.

According to this invention, the foregoing objects are achieved by an ESD protection device disposed on each PCB surface which continuously shorts together a plurality of the conductor pads while the PCB is disconnected from the complementary edge connector. The PCB's engagement with the edge connector automatically disconnects these shorted together conductor pads while the subsequent disengagement of the edge connector from the PCB automatically shorts these conductor pads back together again.

The PCB has a major portion and a dependent integral tongue portion defining substantially planar PCB surfaces oppositely disposed with respect to each other. The PCB further may include a plurality of spaced apart conductor pads disposed on both opposite PCB surfaces along an edge of the tongue. The ESD protection device can be disposed on both opposite PCB surfaces for shorting together a plurality of the conductor pads on both PCB surface or, in an alternate embodiment, the ESD protection device can be disposed on a single PCB surface and only short together a plurality of conductor pads disposed on that PCB surface.

Whether disposed on both PCB surfaces or a single PCB surface, the ESD protection device comprises a hinge structure mounted to the tongue which extends from the PCB and an electrically conductive bar mounted to the hinge structure. The hinge structure can have an arm section cantilevered to a base section which is securely mounted to and electrically isolated from the PCB surface. In an alternative embodiment, the hinge structure can have an arm section cantilevered to a pair of clips removably disposed around the PCB and about the PCB surfaces. One side of the arm section is pivotally secured to the base section or, in the case of the alternative embodiment, to the pair of clips while the opposite second side of the arm section extends laterally over the conductor pads.

The electrically conductive bar is preferably disposed along the entire length of the arm section. If an ESD protection device is disposed on both PCB surfaces, the electrically conductive bar on each opposite PCB surface can have an integral end which extends beyond the edge of the tongue. Each integral end of the electrically conductive bar is structured so as to be in electrical connection with each other when the electrically conductive bars are in contact with their respective conductor pads on the PCB surface. In this manner, electrical interconnection between the electrically conductive bars on each opposite PCB surface is provided when the PCB is in a disconnected state. If, however, an ESD protection device is disposed on only a single PCB surface, the electrically conductive bar only electrically interconnect the conductor pads on the single PCB surface.

In either case above, the arm section is yieldably biased to urge the electrically conductive bar against the conductor pins. This creates an electrical interconnection between the electrically conductive bar and the conductor pads which shorts a plurality of the conductor pads on the PCB surface together. When the tongue is inserted into an elongated receptacle of a corresponding edge connector, the connector engages and deflects the arm section against its yieldable bias, thereby moving the electrically conductive bar out of electrical connection with the conductor pads, and subsequently compressing the electrically conductive bar against the arm section. Upon the removal of the tongue from the edge connector, the yieldable bias of the arm section again urges the electrically conductive bar against and into electrical interconnection with the conductor pads.

Since the electrically conductive bar must compress and then spring back to nearly its original shape, the electrically conductive bar is preferably fabricated out of a light, elastic, electrically conductive material which includes an electrically conductive foam, fiber, plastic, and foil. Moreover, each electrically conductive bar may have slits disposed therein in a direction orthogonal to the tongue edge along which the conductive pads are disposed. These slits provide a more robust, i.e., stable and insensitive to sources of variability, electrical interconnection between the electrically conductive bar and the conductor pads.

DESCRIPTION OF THE DRAWINGS

The novel features that are considered characteristic of the invention are set forth with particularity in the appended claims. The invention itself, however, both as to its organization and its method of operation together with other objects and advantages thereof will be best understood from the following description of the illustrated embodiment when read in connection with the accompanying drawings wherein:

DESCRIPTION OF THE PREFERRED EMBODIMENTS

Figure 1:
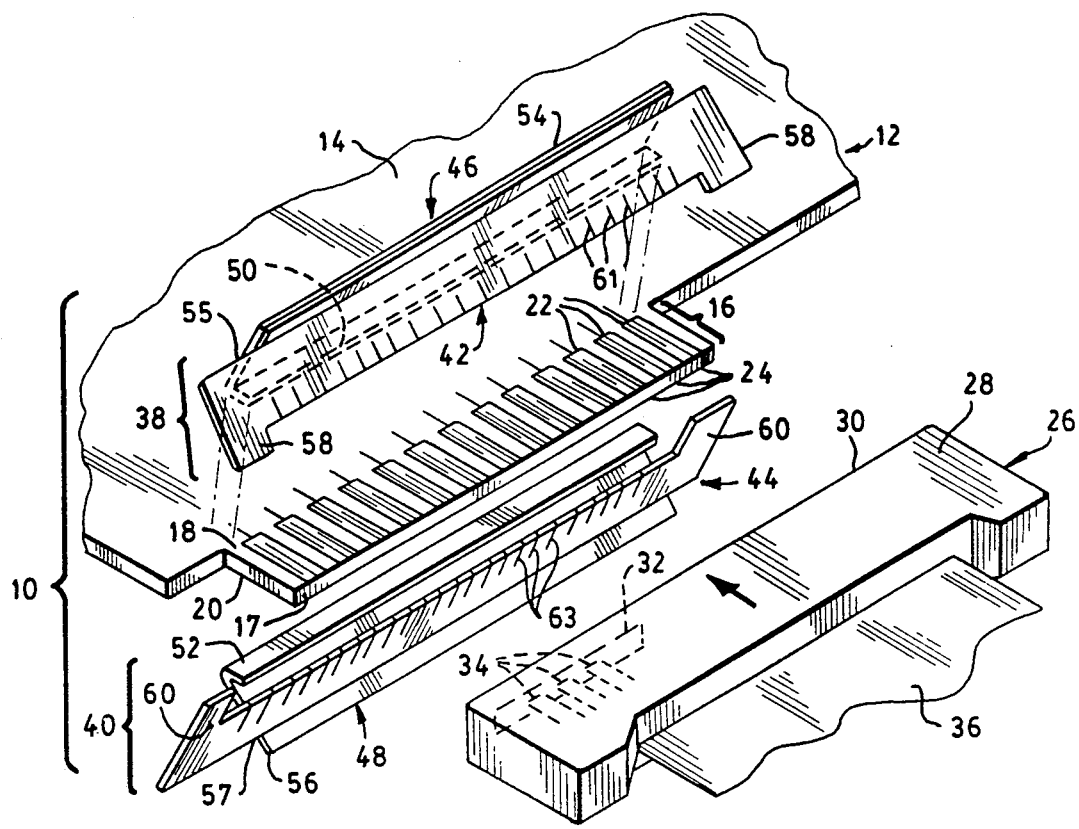
FIG. 1 is an exploded perspective view of the ESD protection devices of this invention disposed above and below a PCB along with a complementary edge connector.
Figure 2:
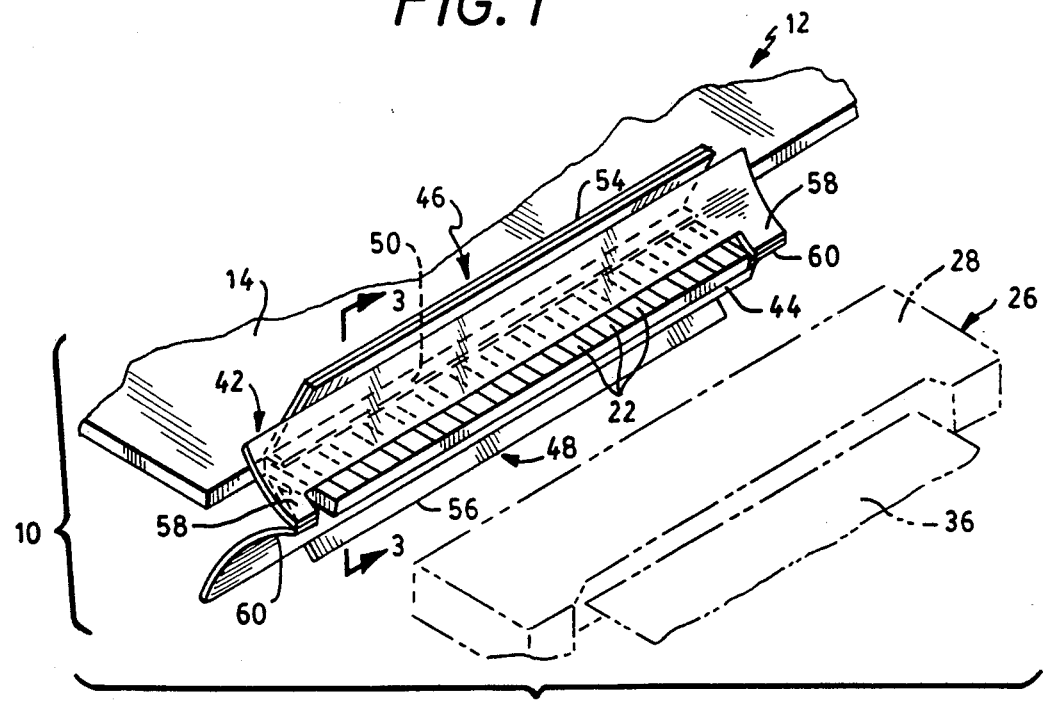
FIG. 2 is a perspective view of the ESD protection devices shown in FIG. 1 mounted to the PCB along with the complementary edge connector.
Figure 3:
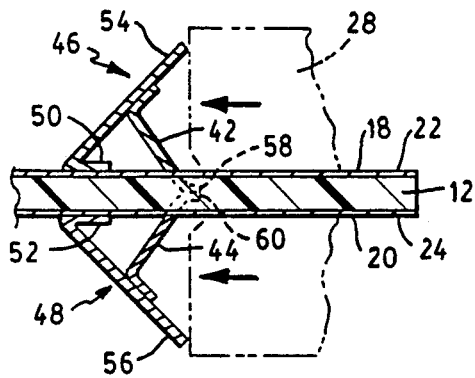
FIG. 3 is a side view as seen along line 3—3 of FIG. 2 of the ESD protection devices and the PCB mating with the complementary edge connector.
Figure 4:
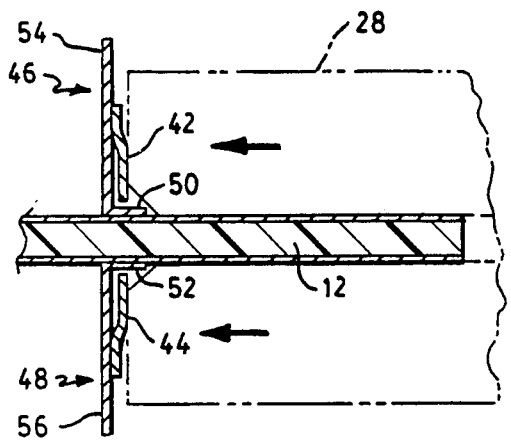
FIG. 4 is a side view showing the ESD protection devices and the PCB completely mated with the complementary edge connector.

Referring now to FIGS. 1-4, there is show generally at 10 a PCB-ESD protected device combination comprising a pair of ESD protection develops of the invention 38 and 40, respectively, a PCB 12, and a complementary edge connector 26. The PCB 12 in one embodiment may comprise a major portion 14 and a dependent integral tongue portion 16 having substantially planar PCB surfaces 18 and 20, respectively, oppositely disposed with respect to each other. A plurality of conductor pads 22 and 24, respectively, are disposed on both PCB surfaces along an edge 17 of the tongue 16 in spaced apart, insulated, linear relationship with respect to each other. As will be readily understood, the major portion 14 may contain a densely populated plurality of electrical components or, in the alternative, may merely house the electrical connection between two remotely located PCB's.

The tongue portion 16 is adapted for ready insertion or withdrawal from the complementary edge connector 26 which comprises a housing 28 defining a substantially planar surface 30 on one selected face thereof. An elongated receptacle member 32 extends inwardly from the planar surface 30 in a complementary relationship with respect to the tongue portion 16 so as to accommodate the ready insertion of the tongue portion 16 into the elongated receptacle member 32. Within the receptacle member resides a plurality of electrical contacts 34 which extend inwardly from the planar surface 30 in spaced apart, insulated, linear relationship with respect to each other and in a complementary relationship with respect to the conductor pads 22, 24. As is readily apparent, connection of the PCB 12 to the edge connector 26 by insertion of the tongue region 16 into the corresponding elongated receptacle member 32 operates to bring each one of the individual conductor pads 22, 24 of the PCB 12 into a substantially contiguous relationship with a corresponding one of the electrical contacts 34. This then electrically interconnects the circuitry found on the major portion 14 to circuitry (not shown) on the opposite end of a flex cable 36.

In order to ensure that the conductor pads 22, 24 are shorted upon the disconnection of the tongue portion 16 from the edge connector 26, there are provided the pair of ESD protection devices as shown generally at 38 and 40. Each of the ESD protection devices 38, 40 comprises, respectively, electrically conductive bars 42, 44 secured, respectively, to hinge structures 46, 48. Hinge structures 46, 48 have respective base sections 50, 52 fixedly connected in overlying relationship, respectively, to PCB surfaces 18, 20. The base sections 50, 52 of the respective ESD protection devices 38, 40 are preferably secured to the PCB 12 on the respective PCB surfaces 18, 20, as shown, but can also be secured outside these areas.

A pair of arm sections 54, 56 are, respectively, cantilevered to the base sections 50, 52 with one side of each of the arm sections 54, 56, as shown at 55, 57 pivotally secured to a corresponding edge of the respective base sections 50, 52 and the cantilevered portions of the arm sections 54, 56 extending laterally over the conductor pads 22, 24, respectively. Each of the electrically conductive bars 42, 44 is fixedly disposed to a respective side of the arm sections 54, 56 and extends laterally outward so as to be in electrically contacting relation, respectively, to the conductor pads 22, 24. Each of the electrically conductive bars 42, 44 also has integral ends 58, 60, respectively, which extend beyond the edge of the tongue portion 16 and which are structured so as to be in electrical connection with each other when the electrically conductive bars 42, 44 are in contact with their respective conductor pads 22, 4. The integral ends 58, 60 operate to electrically interconnect the electrically conductive bars 42, 44 on each side of the PCB surfaces thereby also electrically interconnecting all the conductor pads 22, 24 of the entire PCB together.

The arm sections 54, 56 are yieldably biased by any means well known in the art such as an integral torsion spring so as to urge their respective electrically conductive bars 42, 44 against the conductor pads 22, 24, respectively, thereby creating an electrical interconnection between the electrically conductive bars 42, 44 and the conductor pads 22, 24 disposed on the PCB. Thus, as is readily apparent from FIGS. 1-4, when the edge connector 26 is disconnected from the tongue portion 16, the arm sections 54, 56 urge their respective electrically conductive bars 42, 44 against and into respective electrical connection with the conductor pads 22, 24 of the respective PCB surfaces 18, 20. Moreover, the corresponding integral ends 58, 60 of each respective electrically conductive bar 42, 44 are also urged against and into electrical interconnection with each other and with all the connector pads 22, 24 on the PCB. In this manner, the shorting of all the connector pads 22, 24 is accomplished so as to effectively protect the PCBs circuitry from ESD which could operate to damage the electrical components on the PCB.

Insertion of the tongue portion 16 of the PCB 12 into the complementary receptacle 32 of the edge connector 26 operates to move and deflect the arm sections 54 and 56 against their yieldable bias, thereby moving the electrically conductive bars 42, 44 out of electrical connection with conductor pads 22, 24, and subsequently compressing the electrically conductive bars 42, 44 against the respective arm sections 54, 56. In this manner, the electrically conductive bars 42, 44 are substantially flattened between the arm sections 54, 56, respectively, and the planar surface 30 of the edge connector 26 so as to be out of electrical contact with any of the conductive pods 22, 24.

Since the electrically conductive bars 42, 44 must compress and then spring back to nearly their original shape, these bars are preferably fabricated out of a light, elastic, electrically conductive material which includes an electrically conductive foam, fiber, plastic, and foil. Moreover, each of the electrically conductive bars 42, 44 may have slits 61, 63 disposed therein in a direction orthogonal to the tongue edge 17 along which the conductive pads 22, 24 are disposed. These slits provide a more robust, i.e., stable and insensitive to sources of variability, electrical interconnection between the electrically conductive bar and the conductor pads 22, 24. The electrically conductive bars 42, 44 are secured, respectively, to the arm sections 54, 56, and the base sections 50, 52 are secured, respectively, to the PCB surfaces 18, 20 by any conventional means such as a suitable adhesive or by tack welding. However, the base sections 50, 52 must be secured, respectively, to the PCB surfaces 18, 20 so that the arm sections 54, 56 are perpendicularly disposed with respect to the respective PCB surfaces 18, 20 when the tongue portion 16 is completely inserted within the edge connector 26.

As will be readily apparent, the number of conductive pads on either of the PCB surfaces 18, 20 to be shorted together by the ESD protection devices 38, 40 need not include all the conductive pods 22, 24 as shown in FIGS. 1-4 but may also be limited to any subset of all the conductive pods. Moreover, as discussed earlier, the ESD protection device which shorts together the conductive pads on both PCB surfaces can also be disposed on just a single PCB surface.

Figure 5:
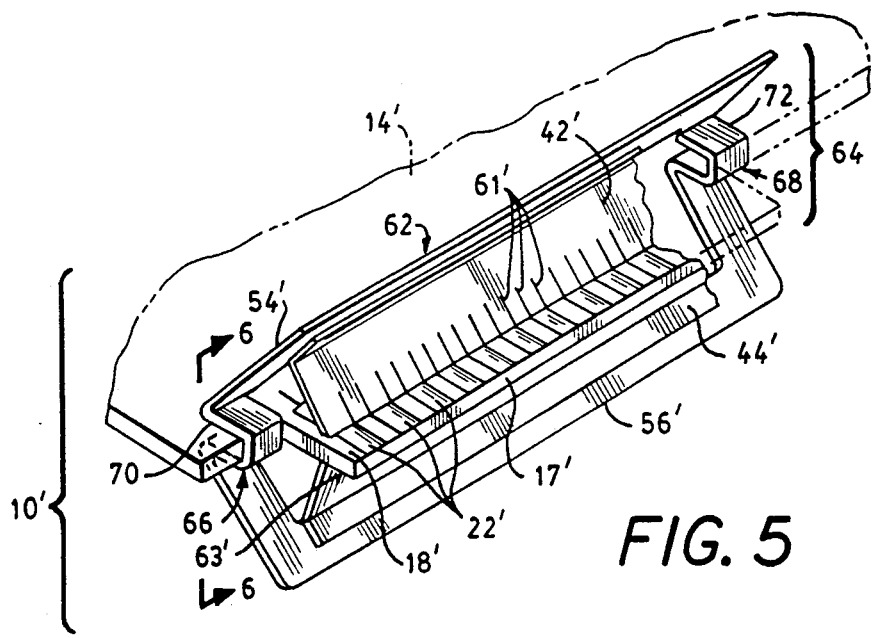
FIG. 5 is a perspective view of an alternate ESD protection device of this invention and a PCB.
Figure 6:
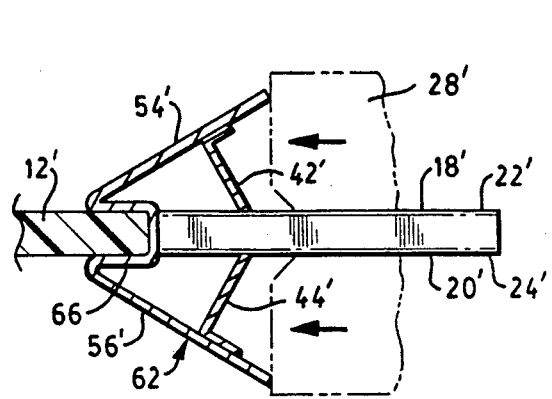
FIG. 6 is a side view as seen along line 6—6 of FIG. 5 of the alternate ESD protection device and the PCB mating with a complementary edge connector.
Figure 7:
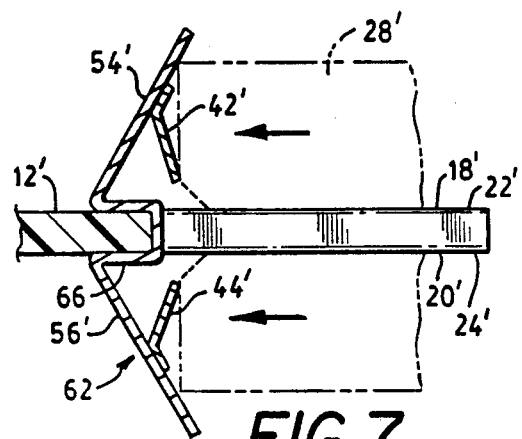
FIG. 7 is a side view showing the alternative ESD protection device and the PCB completely mated with the complementary edge connector.

Referring now to FIGS. 5-7 where like numerals designate previously described elements, there is shown an alternate embodiment for the PCB-ESD protection device combination 10'. In contrast to the previous embodiment, the pair of hinge structures 46', 48' are replaced with a unitary hinge structure 62 which is removably secured to the PCB 12'. This unitary ESD protection device 64 comprises a pair of electrically conductive bars 42', 44' secured to the unitary hinge structure 62. The unitary hinge structure 62 has a pair of clips 66, 68 which is removably secured around the PCB 12' and about the PCB surfaces 18', 20'. Arm sections 54', 56' are cantilevered to each clip with one edge of each arm section 54', 56' as shown at 70, 72 pivotally secured to respective clips 66, 68 and the cantilevered portion of the arm section extending laterally over conductor pads 22', 24'. The electrically conductive bars 42', 44' are fixedly disposed to respective sides of the arm sections 54', 56' and extend laterally outward so as to be urged by the yieldable bias of the arm section 54', 56' into respective electrical contact with the conductor pads 22', 24'.

Thus, as readily apparent, when the tongue portion 16 is disconnected from the complementary edge connector 26, the arm sections 54', 56' urge their respective electrically conductive bars 42', 44' against and into respective electrical connection with the conductor pads 22', 24' of the respective PCB surfaces 18', 20'. Complete insertion of the tongue portion 16' into the complementary edge connector 26' operates to move and deflect the arm sections 54', 56' against their yieldable bias, thereby moving the electrically conductive bars 42', 44' out of respective electrical connection with the conductor pads 22', 24', and subsequently compressing the electrical conductive bars 42', 44' between the planar surface 30' and the arm sections 54', 56', respectively.

Since the electrically conductive bars 42', 44' must compress and then spring back to nearly their original shape, these bars are preferably fabricated out of a light, elastic, electrically conductive material which includes an electrically conductive foam, fiber, plastic, and foil. Moreover, each electrically conductive bar 42', 44' may have slits 61', 63' disposed therein in a direction orthogonal to the tongue edge 17' along which the conductive pads are disposed. These slits provide a more robust, i.e., stable and insensitive to sources of variability, electrical interconnection between the electrically conductive bar and the conductor pads 22', 24'. Also, as discussed above, the electrically conductive bars 42', 44' may be secured, respectively, to the arm sections 54', 56' by any conventional means such as a suitable adhesive or by tack welding. Finally, as will be readily apparent, the number of conductor pads shorted together by this unitary ESD protection device 64 need not include all the conductive pads 22', 24' as shown in FIGS. 5-7 but may also be limited to any subset of the conductive pins.

Other embodiments of the invention including additions, subtractions, deletions, and other modifications of the preferred disclosed embodiments of the invention will be obvious to those skilled in the art and are within the scope of the following claims.

What is claimed is:

1. An electrostatic discharge (hereafter referred to as "ESD") protection device for use with a printed circuit board (hereafter referred to as "PCB") of the type comprising a major portion and a dependent integral tongue portion defining substantially planar first and second PCB surfaces oppositely disposed with respect to each other and further including a plurality of spaced apart first conductor pads disposed on the first PCB surface along an edge of the tongue, the tongue being structured for releasable connection to a standard connector of the type having a receptacle disposed in a front wall of the connector, the receptacle being complementary to the tongue to accommodate the insertion of the tongue into the receptacle, the ESD protection device comprising:
   a) a first elongated electrically conductive bar; and
   b) a first hinge structure comprising an elongated base section securely mounted to and electrically isolated from the first PCB surface, an elongated arm section pivotally connected to the base section and having the first electrically conductive bar disposed along the length thereof, the elongated arm section being yieldably biased towards the base section so as to urge the first electrically conductive bar against the first conductor pads thereby creating an electrical connection therebetween when the tongue is not inserted into the receptacle, the arm section operating to pivot away from the base section against the yieldable bias so as to disengage the first electrically conductive bar from the first conductor pads and to thereby break the electrical connection therebetween in response to the insertion of the tongue into the receptacle and engagement of the arm section with the front wall of the connector.

2. The ESD protection device of claim 1 wherein the PCB further includes a plurality of second conductor pads disposed on the second PCB surface of the tongue opposite the first conductor pads, the ESD protection device further comprising:
   a) a second elongated electrically conductive bar; and
   b) a second hinge structure comprising an elongated base section securely mounted to and electrically isolated from the second PCB surface, an elongated arm section pivotally connected to the base section and having the second electrically conductive bar disposed along the length thereof, the elongated arm section being yielding biased towards the base section so as to urge the second electrically conductive bar against the second conductor pads thereby creating an electrical connection therebetween when the tongue is not inserted into the receptacle, the arm section operating to pivot away from the base section against the yieldable bias so as to disengage the second electrically conductive bar from the second conductor pads and to thereby break the electrical connection therebetween in response to the insertion of the tongue into the receptacle.

3. The ESD protection device of claim 2 wherein the first and second electrically conductive bars have respectively a first integral end and a second integral end, each integral end extending beyond the edge of the tongue, the first and second integral ends being structured so as to be in electrical connection with each other when the electrically conductive bars are yieldably biased into contact with their respective conductor pads and thereby electrically interconnecting the first and second electrically conductive bars.

4. The ESD protection device of claim 2 wherein the first and second electrically conductive bars are selected from the group comprising an elastic, electrically conductive foam, plastic, fiber, and foil.

5. The ESD protection device of claim 2 wherein the first and second electrically conductive bars have multiple spaced apart slits disposed on the bars in a direction orthogonal to the tongue edge along which the conductive pads are disposed.

6. An electrostatic discharge (hereafter referred to as "ESD") protection device for use with a printed circuit board (hereafter referred to as "PCB") of the type comprising a major portion and a dependent integral tongue portion defining substantially planar first and second PCB surfaces oppositely disposed with respect to each other and further including a plurality of spaced apart first conductor pads disposed on the first PCB surface along an edge of the tongue, the tongue being structured for releasable connection to a standard connector of the type having a receptacle disposed in a front wall of the connector, the receptacle being complementary to the tongue to accommodate the insertion of the tongue into the receptacle, the ESD protection device comprising:
   a) a first elongated electrically conductive bar; and
   b) a first hinge structure comprising a pair of clips removably secured around the PCB about the PCB surfaces, an elongated arm section pivotally connected to the clips opposite the first substantially planar PCB surface and having the first electrically conductive bar disposed along the length thereof, the elongated arm section being yieldably biased towards the clips so as to urge the first electrically conductive bar against the first conductor pads thereby creating an electrical connection therebetween when the tongue is not inserted into the receptacle, the arm section operating to pivot away from the biasing clips against the yieldable bias so as to disengage the first electrically conductive bar from the first conductor pads to thereby break the electrical connection therebetween in response to the insertion of the tongue into the receptacle and engagement of the arm section with the front wall of the connector.

7. The ESD protection device of claim 6 wherein the PCB further includes a second plurality of conductor pads disposed on the second PCB surface of the tongue opposite the first conductor pads, the ESD protection device further comprising:
   a) a second elongated electrically conductive bar; and
   b) a second hinge structure comprising an elongated arm section pivotally connected to the clips opposite the second substantially planar PCB surfaces and having the second electrically conductive bar disposed along the length thereof, the elongated arm section being yieldably biased towards the biasing clips so as to urge the second electrically conductive bar against the second conductor pads thereby coating an electrical connection therebetween when the tongue is not inserted into the receptacle, the arm section operating to pivot away from the clips against the yieldable bias so as to disengage the second electrically conductive bar from the second conductor pads and to thereby break the electrical connection therebetween in response to the insertion of the tongue into the receptacle.

8. The ESD protection device of claim 7 wherein the first and second electrically conductive bars have respectively a first integral end and a second integral end, each integral end extending beyond the edge of the tongue, the first and second integral ends being structured so as to be in electrical connection with each other when the electrically conductive bars are yieldably biased into contact with their respective conductor pads and thereby electrically interconnecting the first and second electrically conductive bars.

9. The ESD protection device of claim 7 wherein the first and second electrically conductive bars are selected from the group comprising an elastic electrically conductive foam, plastic, fiber, and foil.

10. The ESD protection device of claim 7 wherein the first and second electrically conductive bars have multiple spaced apart slits disposed on the bars in a direction orthogonal to the tongue edge along which the conductive pads are disposed.

* * * * *